(12) United States Patent
Ameen et al.

(10) Patent No.: US 6,426,146 B1
(45) Date of Patent: Jul. 30, 2002

(54) TREATED COPPER FOIL AND PROCESS FOR MAKING TREATED COPPER FOIL

(75) Inventors: Thomas J. Ameen, Mentor; Edward Czapor, Parma, both of OH (US)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/501,442

(22) Filed: Feb. 10, 2000

Related U.S. Application Data

(62) Division of application No. 09/150,643, filed on Sep. 10, 1998, now Pat. No. 6,132,589.

(51) Int. Cl.$^7$ .......................... B32B 15/08; B32B 27/38
(52) U.S. Cl. ...................... 428/413; 428/220; 428/343; 428/344; 428/447; 428/548; 428/607; 428/450; 205/197
(58) Field of Search ................................ 428/548, 607, 428/220, 343, 344, 447, 450; 205/55, 197

(56) References Cited

U.S. PATENT DOCUMENTS

| | | | |
|---|---|---|---|
| 3,970,608 A | 7/1976 | Furukawa et al. ............. 526/19 |
| 4,061,837 A | 12/1977 | Hutkin ........................ 428/609 |
| 4,088,544 A | 5/1978 | Hutkin ........................ 204/12 |
| 4,409,037 A | 10/1983 | Landan .................. 148/6.14 R |
| 4,499,152 A | * 2/1985 | Green et al. |
| 4,505,418 A | 3/1985 | Neidig et al. ................ 228/122 |
| 4,642,161 A | 2/1987 | Akahoshi et al. ........... 156/630 |
| 4,806,200 A | 2/1989 | Larson et al. ................ 156/652 |
| 4,844,981 A | 7/1989 | Landau ........................ 428/413 |
| 5,017,271 A | 5/1991 | Whewell et al. .............. 204/15 |
| 5,061,550 A | * 10/1991 | Shimizu et al. |
| 5,071,520 A | * 12/1991 | Lin et al. |
| 5,108,026 A | 4/1992 | Su et al. ....................... 228/122 |
| 5,135,629 A | 8/1992 | Sawada et al. ............. 204/192 |
| 5,252,355 A | 10/1993 | Ando et al. .................... 427/98 |
| 5,288,377 A | 2/1994 | Johnson et al. .......... 204/181.3 |
| 5,356,528 A | * 10/1994 | Fukuda et al. |
| 5,382,333 A | 1/1995 | Ando et al. ................. 204/130 |
| 5,389,446 A | 2/1995 | Yamanishi et al. ......... 428/472 |
| 5,431,803 A | 7/1995 | DoFramco et al. ........... 205/50 |
| 5,456,817 A | 10/1995 | Hino et al. .................. 205/125 |
| 5,476,908 A | 12/1995 | Kishi et al. ................. 525/393 |
| 5,478,599 A | 12/1995 | Iyer et al. .................... 427/355 |
| 5,492,722 A | 2/1996 | Tait et al. .................... 427/211 |
| 5,552,234 A | 9/1996 | Kawasumi ................... 428/633 |
| 5,567,534 A | 10/1996 | Yano et al. .................. 428/607 |
| 5,597,876 A | 1/1997 | Murata et al. .............. 525/481 |
| 5,618,891 A | 4/1997 | Markovitz .................. 525/481 |
| 5,622,782 A | 4/1997 | Poutasse, III et al. ....... 428/344 |
| 5,630,874 A | 5/1997 | Tait et al. .................... 118/234 |
| 5,670,250 A | 9/1997 | Sanville, Jr. et al. ........ 428/323 |
| 5,709,957 A | 1/1998 | Chiang et al. .............. 428/615 |
| 5,712,047 A | 1/1998 | Aso et al. .................... 428/607 |
| 5,863,410 A | * 1/1999 | Yates et al. |

OTHER PUBLICATIONS

U.S. Patent Application No. 09/151,220 Filed Sep. 10, 1998, Titled, an Adhesion Promoting Layer for Use With Epoxy Prepregs.
Chapter 9 of Vapor Deposition, C. F. Powell, et al., J. Wiley & Sons, Inc. New York, 1966.
Patent Cooperation Treaty International Search Report, Application No. PCT/US99/21473, dated Jan. 13, 2000.

* cited by examiner

*Primary Examiner*—Robert Dawson
*Assistant Examiner*—Marc S Zimmer
(74) *Attorney, Agent, or Firm*—Renner, Otto, Boisselle & Sklar, LLP

(57) ABSTRACT

This invention relates to a treated copper foil, comprising: a copper foil with a layer of zinc oxide adhered to the base surface of at least on side of said copper foil, said layer of zinc oxide having a thickness of about 3 Å to about 80 Å; and a layer of a trivalent chromium oxide adhered to said layer of zinc oxide. In one embodiment, the foil has a layer of a silane coupling agent adhered to the layer of trivalent chromium oxide. The invention also relates to a process for applying the layer of zinc oxide and the layer of trivalent chromium oxide to the copper foil. The invention also relates to laminates comprising a dielectric substrate and the foregoing copper foil adhered to the substrate. In one embodiment, the dielectric substrate is comprised of an epoxy resin made with a curing agent that is other than an amine curing agent.

18 Claims, No Drawings

TREATED COPPER FOIL AND PROCESS FOR MAKING TREATED COPPER FOIL

This application is a divisional of prior application Ser. No. 09/150,643, filed Sep. 10, 1998 which has evolved into U.S. Pat. No. 6,132,589.

TECHNICAL FIELD

This invention relates to a treated copper foil, and to a process for making the treated copper foil. The treated copper foil has a thin layer of zinc oxide adhered to the base surface of at least are side of the foil and a layer of a trivalent chromium oxide adhered to the layer of zinc oxide. The treated copper foil is useful in making laminates and printed circuit boards.

BACKGROUND OF THE INVENTION

Copper foil is used in the production of printed circuit boards. Although an excellent electronic conductor, there are problems inherent with the use of such foil. Copper is easily oxidized and corroded. In the production of printed circuit boards, it is generally necessary to bond the copper foil to dielectric substrates to provide the foil with dimensional and structural stability. As plated or rolled, the adhesion of copper foil to such substrates is generally insufficient. Copper is also known to accelerate or catalyze the decomposition of dielectric substrates. For these reasons, copper foil is typically sold with one or more protective layers applied to its surface.

The current practice for applying protective layers to copper foil typically involves the following sequence of steps. First: a nodularized or dendritic copper layer is deposited on the foil surface. This dendritic layer can be applied to either the matte side or the shiny side of the foil, or to both sides of the foil. The dendritic layer is applied to increase mechanical interlocking between the dielectric substrate and foil surface to thereby increase the adhesion strength of the foil. Second: a barrier layer typically comprised of brass is then deposited on the dendritic layer of copper. This barrier layer is added to prevent thermal degradation of the metal-resin interface, thereby maintaining adhesion of the foil to the resin. Third: a stabilization layer typically comprised of zinc and chrome is then applied to both sides of the foil. The stabilization layer aids in oxidation resistance, shelf-life and humidity durability.

The foregoing practice has a number of disadvantages. The nodularized copper layer increases foil profile as well as the etching time required to etch circuitry using the foil. The nodularized layer also decreases foil quality by increasing the pit and dent count, and it reduces treat line speed. The application of the barrier layer requires the use of a caustic, cyanide-containing bath which is difficult and costly to waste treat. Application of the barrier layer also requires the use of soluble anodes which contribute to poor foil quality and anodes that are susceptible to polarization. During the application of the stabilization layer undesirable precipitates form in the bath. The present invention overcomes many of these problems by providing a copper foil that does not require the nodularized or dendritic copper layers or the barrier layers required by prior art copper foils, but still possess initial peel strengths and thermal degradation resistance properties that are comparable to prior art foils.

The dielectric substrates used in the market place, which are sometimes referred to as prepregs, are often made using epoxy resins. Many epoxy resin based prepregs that are available are made using amine curing agents, such as dicyandiamine. There are however, a number of problems are associated with the use of such amine curing agents including environmental, safety and handling concerns. Recently, new prepregs based on epoxy resin systems that are made without such amine curing agents have been introduced into the market place. These new epoxy prepregs are sometimes referred to as "non-dicy" prepregs. While these non-dicy prepregs are beneficial, a problem with the use of such prepregs relates to the fact that the initial peel strength between the copper foil and the non-dicy prepreg that is typically achieved is generally less, in some instances about 10% less, than when conventional epoxy prepregs are used. The present invention also overcomes this problem by providing a treated copper foil that can be used with non-dicy prepregs and still provide desired initial peel strength levels.

SUMMARY OF THE INVENTION

This invention relates to a treated copper foil, comprising: a copper foil with a layer of zinc oxide adhered to the base surface of at least on side of said copper foil, said layer of zinc oxide having a thickness of about 3 Å to about 80 Å; and a layer of a trivalent chromium oxide adhered to said layer of zinc oxide. In one embodiment, the foil has a layer of a silane coupling agent adhered to the layer of trivalent chromium oxide. The invention also relates to a process for applying the layer of zinc oxide and the layer of trivalent chromium oxide to said copper foil. The invention also relates to laminates comprised of a dielectric substrate and the foregoing copper foil adhered to the substrate. In one embodiment, the dielectric substrate is comprised of an epoxy resin made with a curing agent that is other than an amine curing agent; that is, the dielectric substrate is a non-dicy prepreg.

DESCRIPTION OF THE PREFERRED EMBODIMENTS

The copper foils used with this invention are made using one of two techniques. Wrought or rolled copper foil is produced by mechanically reducing the thickness of a copper or copper alloy strip or ingot by a process such as rolling. Electrodeposited foil is produced by electrolytically depositing copper ions on a rotating cathode drum and then peeling the deposited strip from the cathode. Electrodeposited copper foils are especially useful with this invention.

The copper foils typically have nominal thicknesses ranging from about 0.0002 inch to about 0.02 inch. Copper foil thickness is sometimes expressed in terms of weight and typically the foils of the present invention have weights or thicknesses ranging from about ⅛ to about 14 oz/ft$^2$. Especially useful copper foils are those having weights of ½, 1 or 2 oz/ft$^2$.

Electrodeposited copper foils have a smooth or shiny (drum) side and a rough or matte (copper deposit growth front) side. The zinc oxide and trivalent chromium oxide layers can be applied to either side of the foil, and in some instances they are applied to both sides.

The side or sides of the foil to which the zinc oxide and trivalent chromium oxide layers are applied can have a "standard-profile surface," "low-profile surface" or "very-low-profile surface." The term "standard-profile surface" is used herein to refer to a foil surface having an $R_{tm}$ of about 7 to about 10 microns. The term "low-profile surface" refers to a foil surface having an $R_{tm}$ of about 4 to about 7 microns or less. The term "very-low-profile surface" refers to a foil surface having an $R_{tm}$ of about 4 microns or less. $R_{tm}$ is the mean of the maximum peak-to-valley measurement from each of five consecutive sampling measurements, and can be measured using a Surftronic 3 profilometer marketed by Rank Taylor Hobson, Ltd., Leicester, England.

The layer of zinc oxide has a thickness of about 3 Å to about 80 Å, and in one embodiment about 5 Å to about 60 Å, and in one embodiment about 10 A to about 50 Å, and in one embodiment about 15 Å to about 40 Å, and in one embodiment about 20 Å to about 35 Å, and in one embodiment about 25 Å to about 32 Å. The thickness of this zinc oxide layer is critical to achieving the desired peel strength properties of the invention. The zinc oxide layer is applied to one or both sides of the copper foil as a layer of zinc metal. The zinc metal layer is then oxidized as discussed below. Prior to oxidation, the zinc metal layer has a thickness of about 2 Å to about 60 Å, and in one embodiment about 2 Å to about 50 Å, and in one embodiment about 5 Å to about 40 Å, and in one embodiment about 10 Å to about 35 Å, and in one embodiment about 1 5 Å to about 30 Å, and in one embodiment about 20 Å to about 25 Å.

The zinc metal layer is applied to the base surface of the side or sides of the copper foil. The base surface of the copper foil is untreated prior to the application of the zinc metal layer. The term "untreated" is used herein to refer to the fact that the base surface of the copper foil has not undergone treatment (e.g., application of a dendritic copper layer, barrier layer, stabilization layer, etc.) for the purpose of refining or enhancing the foil properties. It should be noted, however, that the base surface of the foil may have a naturally occurring, non-dendritic or non-nodular layer of copper oxide adhered to it.

In one embodiment, the layer of zinc metal is applied to the copper foil surface using vapor deposition. Any of the vapor deposition techniques known in the art can be used. These include physical vapor deposition (PVD) and chemical vapor deposition (CVD) techniques. Physical vapor deposition includes thermal evaporation, electron beam deposition, inductive and/or resistive deposition, ion plating, sputtering, plasma-activated evaporation, reactive evaporation, and activated reactive evaporation. Physical vapor deposition also has been referred to in the literature as vacuum metallization and evaporative coating. In thermal evaporation deposition procedures, the zinc metal to be applied to the copper foil is heated in a high vacuum (e.g., $10^{-2}$ to about $10^{-6}$ torr) whereupon the zinc metal evaporates or sublimates and travels to the copper foil surface. In sputtering processes, energetic inert ions created in a plasma discharge impact a target and cause the ejection of zinc metal through momentum exchange. Physical vapor deposition essentially involves the transfer of the zinc metal and the formation of a zinc layer on the copper foil by physical means alone in contrast to chemical vapor deposition in which the zinc metal transfer is effected by chemical reactions induced by temperature or concentration gradients between the substrate and the surrounding gaseous atmosphere. The principals of vapor deposition and procedures useful in vapor depositing various metals is described in *Vapor Deposition*, edited by C. F. Powell et al., John Wiley & Sons, Inc., New York, 1966, which is incorporated herein by reference.

Chemical vapor deposition usually is accomplished by vaporizing a zinc halide and decomposing or reacting the vapors at the foil surface to yield a non-volatile zinc metal on the surface of the foil as a coating. The chemical reactions of vapor deposition can be effected by thermal deposition or pyrolysis, hydrogen reduction, reduction with metal vapors, reaction with the copper foil, chemical transport reactions, etc. These procedures are described in detail in Chapter 9 of *Vapor Deposition*, C. F. Powell, et al., J. Wiley & Sons, Inc., New York, 1966. This chapter is incorporated herein by reference for its description of the CVD processes.

The zinc metal layer can also be applied using electroplating techniques known in the art. The source of zinc ions for the electrolyte solution can be any zinc salt, examples including $ZnSO_4$, $ZnCO_3$, etc. In one embodiment, the electrolyte solution contains an effective amount of a hydrogen inhibitor to inhibit the evolution of hydrogen during plating. The hydrogen inhibitor can be any of the following ions: $P^{+3}$, $W^{+6}$, $As^{+5}$, $As^{+3}$, $Pb^{+2}$, $Pb^{+4}$, $Hg^{+1}$, $Hg^{+2}$, $Cd^{+2}$ or quaternary ammonium ions. $P^{+3}$, $W^{+6}$ and $As^{+5}$ are particularly useful and $P^{+3}$ is especially useful. Sources for these ions include $H_3PO_3$, $Na_2WO_4$, $HAsO_3$, $Pb(SO_4)_2$, $Hg_2SO_4$, $HgSO_4$, $CdSO_4$, and the like. The quaternary ammonium ions can be represented by the formula

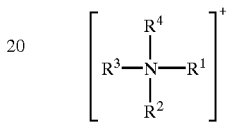

wherein $R^1$, $R^2$, $R^3$ and $R^4$ are independently hydrocarbon groups of 1 to about 16 carbon atoms, and in one embodiment 1 to about 8 carbon atoms, and in one embodiment about 4 carbon atoms. Sources of these ions include tetrabutyl ammonium hydroxide.

The concentration of zinc ions in the electrolyte solution is generally in the range of about 0.1 to about 2 grams per liter (g/l), and in one embodiment about 0.2 to about 1 g/l, and in one embodiment about 0.3 to about 0.7 g/l, and in one embodiment about 0.5 g/l. The concentration of hydrogen inhibitor ions is generally in the range of up to about 1 g/l, and in one embodiment about 0.01 to about 0.8 g/l, and in one embodiment about 0.05 to about 0.5 g/l, and in one embodiment about 0.4 g/l. The electrolyte solution can include other conventional additives such as $Na_2SO_4$, NaCl, NaOH, $K_4P_2O_7$, etc., at concentrations in the range of up to about 100 g/l, and in one embodiment about 5 to about 100 g/l, and in one embodiment about 5 to about 50 g/l, and in one embodiment about 10 to about 30 g/l, and in one embodiment about 10 to about 20 g/l. The pH used in the electrolyte solution is generally in the range of about 4 to about 5.5, and in one embodiment about 4.5 to about 5.5, and in one embodiment about 4.5 to about 5. The current density is generally in the range of about 5 to about 50 amps/ft², and in one embodiment about 15 to about 30 amps/ft², and in one embodiment about 15 to about 25 amps/ft². The temperature of the electrolyte solution is generally in the range of about 20 to about 50° C., and in one embodiment about 30 to about 45° C., and in one embodiment about 35 to about 40° C. The plating time that is used is generally in the range about 1 to about 30 seconds, and in one embodiment about 2 to about 25 seconds, and in one embodiment about 2 to about 10 seconds, and in one embodiment of about 2 to about 6 seconds, and in one embodiment about 2 to about 4 seconds.

The zinc metal layer is oxidized by applying a hexavalent chromium oxide layer to its surface using known electroplating techniques. During this process the hexavalent chromium oxide is converted or reduced to trivalent chromium oxide. The resulting trivalent chromium oxide layer has a thickness of about 20 A to about 100 Å, and in one embodiment about 20 Å to about 60 Å, and in one embodiment about 30 Å to about 40 Å. The source of hexavalent chromium oxide can be chromium trioxide ($CrO_3$), a chromyl ($CrO_2^{++}$) compound such as chromyl amide ($CrO_2(NH_2)_2$) or chromylchloride ($CrO_2Cl_2$), a chromate ($CrO_4^=$) compound such as $Na_2CrO_4$ or $K_2CrO_4$, or a dichromate ($Cr_2O_7^=$) compound such as $Na_2Cr_2O_7$ or $K_2Cr_2O_7$. The concentration of hexavalent chromium oxide compounds in the electrolyte solution is generally in the range of about 1 to about 5 g/l, and in one embodiment about 2 to about 4 g/l, and in one embodiment about 3 g/l. The electrolyte solution can include other conventional additives such as $Na_2SO_4$ at concentrations in the range of about up to about 15 g/l, and in one embodiment 1 to about 15 g/l. The pH used in the electrolyte solution is generally in the range of about 1.5 to about 9, and in one embodiment about 2 to about 6, and in one embodiment about 4.5 to about 5.5. The current density is generally in the range of about 2 to about 20 amps/ft$^2$, and in one embodiment about 10 to about 20 amps/ft$^2$. The temperature of the electrolyte solution is generally in the range of about 20 to about 50° C., and in one embodiment about 35 to about 40° C. The plating time that is used is generally in the range of about 2 to about 15 seconds, and in one embodiment about 5 to about 12 seconds, and in one embodiment about 10 seconds.

A layer of a silane coupling agent can be applied to the layer of trivalent chromium oxide. The silane coupling agent can be represented by the formula

$$R_{4-n}SiX_n$$

wherein R is a functionally substituted hydrocarbon group, the functional substituent of said functionally substituted hydrocarbon group being amino, hydroxy, halo, mercapto, alkoxy, acyl, or epoxy; X is a hydrolyzable group, such as alkoxy (e.g., methoxy, ethoxy, etc.), or halogen (e.g., chlorine); and n is 1, 2 or 3, and preferably n is 3. The silane coupling agents represented by the above formula include halosilanes, aminoalkoxysilanes, aminophenylsilanes, phenylsilanes, heterocyclic silanes, N-heterocyclic silanes, acrylic silanes, mercapto silanes, and mixture of two or more thereof.

Useful silane coupling agents include aminopropyltrimethoxy silane, tetramethoxy silane, tetraethoxy silane, bis(2-hydroxyethyl)-3-aminopropyltriethoxy silane, 3-(N-styrylmethyl-2-aminoethylamine)propyltrimethoxy silane, 3-glycidoxypropyltrimethoxy silane, N-methyl aminopropyltrimethoxy silane, 2-(2-aminoethyl-3-aminopropyl) trimethoxy silane, N-phenylaminopropyltrimethoxy silane, chlorpropyltrimethxy silane, and mixtures of two of more thereof.

A useful silane coupling agent mixture is 3-glycidoxypropyltrimethoxy silane, and tetramethoxy silane or tetraethoxy silane. The weight ratio of the former to the latter can range from about 1:10 to about 10:1, and in one embodiment about 1:5 to about 5:1, and in one embodiment the weight ratio is about 4:1.

A useful silane coupling agent mixture is N-methylaminopropyltrimethoxy silane and chloropropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-(N-styrylmethyl-2-aminoethyl amino)propyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-glycidoxypropyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:3.

The coating of the trivalent chromium oxide surface with the silane coupling agent may be effected by applying the silane coupling agent in neat form to the surface. However, it is generally preferred that coating be effected by applying the silane coupling agent in a suitable medium to the trivalent chromium oxide surface. More specifically, the silane coupling agent can be applied to the trivalent chromium oxide surface in the form of a solution in water, a mixture of water and alcohol, or a suitable organic solvent, or as an aqueous emulsion of the silane coupling agent, or as an aqueous emulsion of a solution of the silane coupling agent in a suitable organic solvent. Conventional organic solvents may be used for the silane coupling agent and these include, for example, alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane coupling agent may be formed in conventional manner using conventional dispersants and surfactants, including non-ionic dispersants. The concentration of the silane coupling agent in such solutions or emulsions can be up to about 100% by weight of the silane coupling agent, and in one embodiment up to about 50% by weight, and in one embodiment up to about 20% by weight, and in one embodiment in the range of about 0.1% to about 5% by weight, and in one embodiment about 0.3% to about 1% by weight. The process of coating with the silane coupling agent may be repeated, if desired, several times. The silane coupling agent may be applied to the foil surface using known application methods which include reverse roller coating, doctor blade coating, dipping, painting, spraying, and the like.

The application of the silane coupling agent to the trivalent chromium oxide surface is typically effected at a temperature of about 15° C. to about 45° C., and in one embodiment about 20° C. to about 30° C. Following application of the silane coupling agent to the trivalent chromium oxide surface, the silane coupling agent can be heated to a temperature of about 60° C. to about 170° C., and in one embodiment about 90° C. to 150° C., for generally about 0.1 to about 5 minutes, and in one embodiment about 0.2 to about 2 minutes, to enhance drying of the surface. The dry film thickness of the silane coupling agent is generally from about 0.002 to about 0.1 micron, and in one embodiment about 0.005 to about 0.02 microns.

The inventive copper foils can be bonded to dielectric substrates to provide such foils with dimensional and structural stability. As indicated above, the dielectric substrates are sometimes referred to as prepregs. Useful dielectric substrates may be prepared by impregnating woven glass reinforcement materials with partially cured resins, usually epoxy resins (e.g., difunctional, tetrafunctional and multi-functional epoxies). Other useful resins include amino type resins produced from the reaction of formaldehyde and urea or formaldehyde and melamine, polyesters, phenolics, silicones, polyamides, polyimides, di-allyl phthlates, phenylsilanes, polybenizimidazoles, diphenyloxides, polytetrafluoroethylenes, cyanate esters, and the like.

In one embodiment, the resin used to make the pregreg is an epoxy resin made with a curing agent that is other than an amine curing agent. That is, these epoxy resins are not made with amine curing agents. The amine curing agents that are avoided include polyamines such as dicyandiamine, polymethylenediamine, polyetherdiamine and other aliphatic polyamines, alicyclic polyamines such as menthanediamine, and aromatic polyamines such as phenylenediamine, toluenediamine and methylenedianiline. These resins are sometimes referred to as "non-dicy" resins. The prepregs made with these resins are sometimes referred to as non-dicy prepregs.

The epoxy resins that are useful include the thermosettable resins made from epoxy monomers or epoxy prepolymers and non-amine curing agents. Curing agents are coreactive, polyfunctional reagents that possess active hydrogen atoms. The epoxy resins which can be used in preparing the prepregs include monofunctional epoxy resins, difunctional epoxy resins, trifunctional epoxy resins, tetrafunctional epoxy resins, pentafunctional epoxy resins, and blends, mixtures and reaction products thereof. Generally speaking, these epoxy resins can be made by reacting epichlorohydrin with mono-, di-, and trihydroxyphenolic compounds, polynuclear polyhydroxy phenolic compounds and/or aliphatic polyols. Examples of di- and trihydroxyphenolic compounds include resorcinol and phloroglucinol; examples of polynuclear polyhydroxy phenolic compounds include bis(p-hydroxyphenyl)methane and 4,4'-dihydroxybiphenyl; and examples of aliphatic polyols include 1,4-butanediol and glycerol. The epoxy resins can also be made by reacting a phenol, such as phenol, cresol, resorcinol or bisphenol-A, with formaldehyde in an acid solution.

The curing agent is present in the epoxy resin composition in an amount effective to cure the epoxy compound, which is generally a stoichiometric amount of about 0.75 to about 1.25 equivalents per equivalent of epoxy compound. In terms of weight percent, the curing agent is present in an amount generally from about 10 to about 70 weight percent, and in one embodiment about 15 to about 50 weight percent, and in one embodiment about 15 to about 40 weight percent, based on the combined weight of epoxy compound and curing agent.

In one embodiment, the curing agent is a compound containing C, H and O atoms and optionally halogen atoms such as Br atoms. Effective curing agents for these epoxy resins include, for example, acids (especially organic carboxylic acids and acid salts), anhydrides (especially organic acid anhydrides), alkoxides, phenoxides, polymeric thiols and phenols. Phenol curing agents include phenol-novolac compounds, as well as cresol-novolac compounds, and other polyhydric phenol compounds.

Phenol curing agents further include polyvalent phenols, such as resorcinol, catechol, hydroquinone, p-t-butylcatechol, saligenin, bisphenol-A, biphenol, trimethylolallyloxyphenol, trihydroxydiphenyidimethylethane, 4,4'-dihydroybiphenyl, dihydroxydiphenylsulfone, and phenol resin.

Acid curing agents include inorganic acids such as mineral acids, and organic acids such as polycarboxylic acids, such as adipic acid, phthalic acid, glutaric acid, malonic acid, succinic acid, maleic acid, fumalic acid, oxalic acid, citraconic acid, itaconic acid, trimellitic acid, pyromellitic acid, cyclopentanetetracarboxylic acid, dimer acid and polyacrylic acid.

Anhydride curing agents include phthalic anhydride, succinic anhydride, itaconic anhydride, citraconic anhydride, alkenyl acid anhydride, dodecenyl succinic anhydride, tricarballyic anhydride, maleic anhydride, maleic anhydride adduct of linoleic acid, copolymer of maleic anhydride with styrene, maleic anhydride adduct of conjugated diene polymer, maleic anhydride adduct of acetylene-conjugated diene random copolymer, maleic anhydride adduct of natural fat, maleic anhydride adduct of methylcyclopentadiene, methyl-2-substituted butenyltetrahydrophthalic anhydride, hexahydrophthalic anhydride, tetrahydrophthalic anhydride, methyltetrahydrophthalic anhydride, pyromellitic anhydride, cyclopentane tetracarboxlic anhydride, benzophenone tetracarboxlic anhydride, ethyleneglycol, bistrimellitate, trimellitic anhydride, dodecylsuccinic anhydride, and dichlorosuccinic anhydride.

In one embodiment, the curing agent is a phenolic compound having a phenolic functionality greater than about 1.75. These include are phenolic novolacs prepared by reacting a dihydroxy phenol such as resorcinol or bisphenol-A with formaldehyde in acid solution. A useful phenolic novolac resin curing agent is bisphenol-A with formaldehyde in acid solution. A useful phenolic novolac resin curing agent is a bisphenol-A novolac having a weight per phenolic group of about 60 to about 500, and in on embodiment about 60 to about 300 and, on the average, more than about 2 phenolic hydroxyl groups per molecule, and in one embodiment 3 to about 5. These phenolic novolac curing agents are available under the trade designation Epikure® from Shell, for example Epikure® DX-175.

In one embodiment, the curing agent for the epoxy resin is a bisphenol-A formaldehyde novolac available from Georgia Pacific Resins, Inc. under the trade designation BRWE 5300. This curing agent is made with an acidic catalyst, usually oxalic acid, and is characterized by a melt viscosity of about 800 to about 1600 centipoise at about 125° C., a hydroxyl equivalent weight of 120, and a Mettler softening point of about 80° C. to about 105° C.

In one embodiment, the curing agent is a mixture of a phenolic resin curing agent and a brominated phenolic curing agent. The brominated phenolic curing agent can be any monomeric or polymeric compound having at least one free phenolic hydroxyl group and one or more bromine atoms on the aromatic ring. Examples of suitable brominated phenolic curing agents include brominated bisphenol-A novolac, brominated phenolic novolac, brominated polyphenylene oxide, brominated bisphenol-A and brominated bisphenol-A carbonate. The brominated bisphenol-A is present in an amount generally up to about 40 weight percent, usually about 10 to about 30 weight percent, based on the combined weight of the epoxy compound and curing agent.

In order to promote faster and/or lower temperature cure of the components of the epoxy resin composition, an optional cure accelerator may be used. Many suitable accelerators, such as ureas, imidazoles, phosphenes, octoates and boron trifluorides, for example, are known in the art. In one embodiment, the accelerator is an imidazole such as 1-methyl imidazoles, 2-ethyl imidazole, 2-methyl imidazole, 2-methyl-4-ethyl imidazole or isopropyl imidazole. The accelerator is present in the composition in an amount effective to increase the cure rate and/or lower the cure temperature of the composition, generally in an amount from about 0.1 to about 7 weight percent, and in one embodiment about 0.05 to about 3 weight percent, based on the weight of the epoxy resin composition.

The epoxy resin is designed within certain specifications dictated by the application process parameters of the epoxy prepreg. The epoxy resin formulation typically is a liquid at a temperature at which the epoxy resin does not undergo cure over the time necessary for application of the epoxy resin to the substrate. The epoxy resin typically is of sufficiently low viscosity that it achieves good "wetout", or saturation of the web, without the use of a pressure backup roll at the point of application and without the use of substantial amounts of volatile organic solvents. Once the applied to the substrate, however, the epoxy resin typically has sufficient viscosity so that it does not drop from the epoxy resin—web combination before it reaches the heating zone.

In one embodiment, the epoxy resin has a viscosity in the range of about 0.5 to about 10 poise, and preferably about 0.5 to about 6 poise. In one embodiment, the epoxy resin is a blend of a diglycidyl ether of bisphenol-A having a WPE of about 175–190, a brominated diglycidyl ether of bisphenol-A having a WPE of about 310 to about 350 and a bromine content of about 30–50 percent, a phenolic novolac curing agent, and 2-methylimidazole accelerator.

In one embodiment, the epoxy resin includes an aqueous organic solvent or diluent that is present in an amount effective to decrease the viscosity of the system for ease of processing. Examples of aqueous or polar organic solvents include ketones, alcohols and glycol ethers. Useful solvents generally have boiling points below about 160° C. These solvents include ketones, such as acetone, methyl ethyl ketone and methyl isobutyl ketone, for example, and solvent mixtures of these with an alkylene glycol ethers such as propylene glycol monomethyl ether. The amount of solvent in the composition can vary widely depending upon the amount of the other constituents present and the intended application of the composition, but the solvent in a solvent-borne system will generally constitute from about 1 to about 40 weight percent of the total weight of the epoxy resin.

Useful epoxy resins include epoxy novolacs such as DEN 439 and DEN 438, available from Dow Chemical Co. The DEN 439 resin is characterized by an epoxide functionality of 3.8, an epoxide equivalent weight of 191 to 210, and a Mettler softening point of about 48° C. to about 58° C. DEN 438 is characterized as having an epoxide functionality of 3.6, an epoxide equivalent weight of 176 to 181, and a viscosity of about 20,000 to about 50,000 cps at about 52° C. Another epoxy novolac resin that can be used is DEN 485, also manufactured by Dow Chemical Co. DEN 485 has an epoxide functionality of 5.5, an epoxide equivalent weight of 165 to 195, and a softening point of about 66° C. to about 80° C.

Other epoxy resins include epoxy cresol novolacs made by the Ciba Chemical Co., such as: ECN 1235 with an epoxide functionality of 2.7, an epoxide equivalent weight of 200 to 227, and melting point of about 34° C. to about 42° C.; ECN 1273 with an epoxide functionality of 4.8, an epoxide equivalent weight of 217 to 233, and a melting point of about 68° C. to about 78° C.; ECN 1280 with an epoxide functionality of 5.0, an epoxide equivalent weight of 213 to 233, and melting point of about 78° C. to about 85° C.; and ECN 1299 with an epoxide functionality of 5.4, an epoxide equivalent weight of 217 to 244, and a melting point of about 85° C. to about 100° C.

Suitable epoxy resins also include tetra functional phenol such as MT0163, available from Ciba Chemical Co. and having an epoxy functionality of 4, an epoxide equivalent weight of 179 to 200, and a melting point of about 55° C. to about 95° C., and EPON® 1031, available from Shell. and having an epoxide functionality of 3.5, and an epoxide equivalent weight of 200 to 240, which is a solid resin having a kinematic viscosity of about Z2 to about Z7 at about 25° C. as an 80 percent weight solution in methyl ethyl ketone.

Other suitable epoxy resins include modified epoxy novolacs such as EPI-REZ SU resins made by Shell, such as EPI-REZ SU-2.5 with an epoxide functionality of 2.5, an epoxide equivalent weight of 180 to 200, and a melt viscosity of about 2500 to about 4500 centistokes at about 52° C., EPI-REZ SU-3.0 with an epoxide functionality of 3.0, an epoxide equivalent weight of 187 to 211, and a melt viscosity of about 20,000 to about 50,000 centistokes at about 52° C. and EPI-REZ SU-8 with an epoxide functionality of 8.0, an epoxide equivalent weight of 195 to 230, and a melting point of about 77° C. to about 82° C.

A useful difunctional epoxy resin is the bisphenol-A diglycidyl ether epoxy resin EPON® 826, available from Shell. This resin is characterized by an epoxide functionality of 2, an epoxide equivalent weight of 178 to 186, and a viscosity of about 6500 to about 9500 cps at about 25° C. Offsets of EPON® 826 include Araldite GY 6008 available from Ciba Chemical Co., DER 333 available from Dow Chemical Co., and EPOTUF 37-139 available from Reichold Co.

Other suitable bisphenol-A diglycidyl ether epoxy resins include the following made by Shell: EPON® 828 with an epoxide equivalent weight of 185 to 192 and a viscosity of about 11,000 to about 15,000 cps at about 25° C.; EPON® 830 with an epoxide equivalent weight of 190 to 198 and a viscosity of about 17,700 to about 22,500 cps at about 25° C.; EPON® 1123, a brominated diglycidyl ether of bisphenol-A having a molecular weight of about 800; and EPON® 834 with an epoxide equivalent weight of 230 to 280 and a Gardner-Holdt viscosity O-V at about 25° C. when measured as a 70 percent weight solution in diethylene glycol monobutyl ether.

Suitable bisphenol-F diglycidyl ether epoxy resins include EPON® DPL-862, made by Shell and having an epoxide equivalent weight of 166 to 177 and a viscosity of about 3,000 to about 4,500 cps at about 25° C., and bisphenol-F diglycidyl ether epoxy resins made by Ciba Chemical Co., such as Araldite GY 281 with an epoxide equivalent weight of 158 to 175 and a viscosity of about 5,000 to about 7,000 cps at about 25° C., and Araldite GY 308 with an epoxide equivalent weight of 173 to 182 and a viscosity of about 6,500 to about 8,000 cps at about 25° C.

Other epoxy resins that can be used include cycloaliphatic epoxy resins such as: 3,4-epoxycyclohexymethyl -3,4-epoxycyclohexane carboxylate (ERL 4221 from Union Carbide), with an epoxide equivalent weight of 131 to 143 and a viscosity of about 350 to about 450 cps at about 25° C.; 2-(3,4-epoxy-cyclohexyl-5,5-spiro-3,4-epoxy) cyclohexane metadioxane (ERL 4234 from Union Carbide), with an epoxide equivalent weight of 133 to 154 and a viscosity of about 7,000 to about 17,000 cps at about 38° C.; and 3,4-epoxy-6-methyl-cyclohexylmethyl adipate (ERL 4289 from Union Carbide), with an epoxide equivalent weight of 205 to 216 and a viscosity of about 500 to about 1000 cps at about 25° C. Offsets of any of the epoxy resins made by other manufacturers or mixtures of epoxy resins can also be used.

Specific examples of commercially available non-dicy epoxy prepregs (not made with amine curing agents) include those under the trade designations "TS" available from General Electric, "ATS" available from Polyclad, and "Driclad" available from IBM.

In preparing the laminates, it is useful for both the prepreg material and the copper foil to be provided in the form of long webs of material rolled up in rolls. In one embodiment these long webs of foil and prepreg are laminated using a continuous process. In this process a continuous web of the foil is brought into contact with a continuous web of prepreg material under laminating conditions to form a laminate structure. This laminate structure is then cut into rectangular sheets and the rectangular sheets are laid-up or assembled in stacks of assemblages.

In one embodiment, the long webs of foil and prepreg material are first cut into rectangular sheets and then subjected to lamination. In this process rectangular sheets of the foil and rectangular sheets of the prepreg material are laid-up or assembled in stacks of assemblages.

Each assemblage may comprise a prepreg sheet with a sheet of foil on either side thereof. The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second prepreg is then adhered to the etched pattern. Techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

The following examples are provided for purposes of illustrating the invention. Unless otherwise indicated, in the following examples as well as throughout the specification and claims, all parts and percentages are by weight, all temperatures are in degrees Celsius, and all pressures are atmospheric.

EXAMPLE 1

An electrodeposited copper foil sample having a weight of one oz/ft$^2$ is plated on its matte side with a layer of zinc metal using a cylindrical cathode rotating at a surface speed of 150 ft./min. under the following conditions:

$ZnSO_4$: 0.5 g/l of $Zn^{++}$ ions
$H_3PO_3$: 0.4 g/l of $P^{+++}$ ions
$Na_2SO_4$: 15 g/l
Bath pH: 5.0
Current density: 25 amps/ft$^2$
Plating time: 20 seconds
Bath temperature: 37.8° C. (100° F.)

The zinc metal layer has a thickness of 49 Å. The zinc metal layer is oxidized by contacting it with a $CrO_3$ solution (3.0 g/l) having a pH adjusted to 5.0 with NaOH using a current density of 18 amps/ft$^2$ for 10 seconds. The thickness of the resulting trivalent chromium oxide layer is 30–40 Å. The sample is then dried and coated with a layer of a silane coupling agent by dipping the sample in a 0.5% by weight aqueous solution of an epoxy silane. The sample is dried. The thickness of the dried silane coating is about 50 Å. The resulting treated copper foil is laminated to a non-dicy prepreg. The prepreg material is Polyclad ATS, a product of Polyclad identified as a prepreg made with a tetrafunctional epoxy resin and a non-amine curing agent. The sample is tested for initial peel strength and HCl-undercut. The initial peel strength is 9 lb/inch. The HCl-undercut is 13.3%. (HCl-undercut is a measure of percent peel strength loss after soaking the sample for one hour in 18% HCl.).

EXAMPLE 2

An electrodeposited copper foil sample having a weight of one of/ft$^2$ is plated on its matte side with a layer of zinc metal using a rotating cylindrical cathode rotating at a surface speed of 40 ft./min. under the following conditions:

$ZnSO_4$: 0.62 g/l of $Zn^{++}$ ions
$H_3PO_3$: 0.45 g/l of $P^{+++}$ ions
$Na_2SO_4$: 18 g/l
Bath pH: 4.7
Current density: 17.5 amps/ft$^2$
lating time: 2.7 seconds
Bath temperature: 37.8° C. (100° F.)

The zinc metal layer has a thickness of 22 Å. The zinc metal layer is oxidized by contacting it with a $CrO_3$ solution (3.0 g/l) having a pH adjusted to 5.1 with NaOH using a current density of 12 amps/ft$^2$ for 10 seconds. The thickness of the resulting trivalent chromium oxide layer is 30–40 Å. The sample is then dried and coated with a layer of a silane coupling agent by dipping the sample in a 0.5% by weight aqueous solution of an epoxy silane. The sample is dried. The thickness of the dried silane coating is about 100 Å. The resulting treated copper foil is laminated to a non-dicy prepreg. The prepreg material is Polyclad ATS. The sample is tested for initial peel strength and HCl-undercut. The initial peel strength is 8.1 lb/inch. The HCl-undercut is 17.1%.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A treated copper foil, comprising:
    a copper foil with a layer of zinc oxide adhered to the base surface of at least one side of said copper foil, said layer of zinc oxide having a thickness of about 3 Å to about 80 Å; and
    a layer of a trivalent chromium oxide adhered to said layer of zinc oxide.

2. The foil of claim 1 wherein a layer of a silane coupling agent is adhered to an outer surface of said layer of trivalent chromium oxide.

3. The foil of claim 1 wherein said foil is an electrodeposited copper foil.

4. The foil of claim 1 wherein said foil is a wrought copper foil.

5. The foil of claim 1 wherein said trivalent chromium oxide layer is formed using a hexavalent chromium oxide.

6. The foil of claim 1 wherein said trivalent chromium oxide layer is formed using $CrO_3$, a chromyl compound, a chromate compound or a dichromate compound.

7. The foil of claim 1 wherein said copper foil has a matte side and a shiny side, said layer of zinc oxide and said layer of trivalent chromium oxide overlying said matte side.

8. The foil of claim 1 wherein said copper foil has a matte side and a shiny side, said layer of zinc oxide and said layer of trivalent chromium oxide overlying said shiny side.

9. The foil of claim 1 wherein said layer of zinc oxide and said layer of trivalent chromium oxide overlie one side of said foil, and another layer of zinc oxide and another layer of trivalent chromium oxide overlie the other side of said foil.

10. The foil of claim 1 wherein said side of said copper foil has a standard-profile surface.

11. The foil of claim 1 wherein said side of said copper foil has a low-profile surface.

12. The foil of claim 1 wherein said side of said copper foil has a very low-profile surface.

13. The foil of claim 2 wherein said silane coupling agent is represented by the formula $$R_{4-n}SiX_n$$

wherein R is a functionally substituted hydrocarbon group, the functional substituent of said functionally substituted hydrocarbon group being amino, hydroxy, halo, mercapto, alkoxy, acyl or epoxy; X is a hydrolyzable group; and n is 1, 2 or 3.

14. The foil of claim 2 wherein said silane coupling agent is a halosilane, aminoalkoxysilane, aminophenylsilane, phenylsilane, heterocyclic silane, N-heterocyclic silane, acrylic silane, mercapto silane, or a mixture of two or more thereof.

15. The foil of claim 2 wherein said silane coupling agent is selected from the group consisting of aminopropyltrimethoxy silane, tetramethoxy silane, tetraethoxy silane, bis(2-hydroxyethyl)-3-aminopropyltriethoxy silane, 3-(N-styrylmethyl-2-aminoethylamine)propyltrimethoxy silane, 3-glycidoxypropyltrimethoxy silane, N-methylaminopropyltrimethoxy silane, 2-(2-aminoethyl-3-aminopropyl)trimethoxy silane, N-phenylaminopropyltrimethoxy silane, chloropropyltrimethoxy silane, and mixtures of two of more thereof.

16. A laminate comprising a dielectric substrate and the copper foil of claim 1 adhered to said substrate.

17. A laminate comprising a dielectric substrate and a copper foil adhered to said substrate;

wherein the copper foil is a treated copper foil, comprising a copper foil with a layer of zinc oxide adhered to the base surface of at least one side of said copper foil, said layer of zinc oxide having a thickness of about 3 Å to about 80 Å; and a layer of a trivalent chromium oxide adhered to said layer of zinc oxide; and wherein said dielectric substrate is comprised of an epoxy resin made with a curing agent that is other than an amine curing agent.

18. The laminate of claim 17 wherein said curing agent is an acid, anhydride, alkoxide, phenoxide, polymeric thiol or phenol.

* * * * *